United States Patent
Scholl et al.

(10) Patent No.: US 7,154,278 B2
(45) Date of Patent: Dec. 26, 2006

(54) ARRANGEMENT FOR DETECTING A LEAKAGE CURRENT OR DEFECT CURRENT

(75) Inventors: Frank Scholl, Ingersheim (DE); Guenter Herrmann, Stuttgart (DE)

(73) Assignee: Knorr-Bremse Systeme fuer Nutzfahrzeuge GmbH, Munich (DE)

( * ) Notice: Subject to any disclaimer, the term of this patent is extended or adjusted under 35 U.S.C. 154(b) by 0 days.

(21) Appl. No.: 11/078,485

(22) Filed: Mar. 14, 2005

(65) Prior Publication Data
US 2006/0114000 A1 Jun. 1, 2006

(30) Foreign Application Priority Data
Mar. 12, 2004 (DE) .................... 10 2004 012 102

(51) Int. Cl.
G01R 31/08 (2006.01)
G01R 31/14 (2006.01)
(52) U.S. Cl. .................. 324/522; 324/628; 324/510
(58) Field of Classification Search ............. 324/522, 324/510, 628, 627
See application file for complete search history.

(56) References Cited

U.S. PATENT DOCUMENTS

| | | | |
|---|---|---|---|
| 4,577,149 A | 3/1986 | Zbinden | |
| 5,962,934 A | 10/1999 | Fendt et al. | |
| 6,115,831 A | 9/2000 | Hanf et al. | |
| 6,702,405 B1 * | 3/2004 | Balz et al. | 303/192 |
| 6,924,651 B1 * | 8/2005 | Osaka et al. | 324/628 |

FOREIGN PATENT DOCUMENTS

| | | |
|---|---|---|
| DE | 39 00 040 A1 | 7/1990 |
| EP | 0 418 665 A1 | 3/1991 |
| EP | 1 059 537 A2 | 12/2000 |
| JP | 07 321427 A | 12/1995 |

OTHER PUBLICATIONS

Bosch Automotive Group, Controller Area Network, Dec. 5, 2005, http://www.semiconductors.bosch.de/de/20/can/index.asp, http://www.semiconductors.bosch.de/de/20/can/1-about.asp.*

* cited by examiner

*Primary Examiner*—Diane Lee
*Assistant Examiner*—John Zhu
(74) *Attorney, Agent, or Firm*—Crowell & Moring LLP

(57) ABSTRACT

The invention is based on a circuit arrangement for the detection of a leakage current or defect current, by means of which the power supply of an electronic circuit can be switched off.

It is suggested that a track conductor connected with a signal line or an insulation-layer-free conductor connected with a signal line or an insulation-layer-free part of the signal line itself is arranged such that it crosses a potential leakage or defect current connection path of a short circuit between the power supply lines.

15 Claims, 1 Drawing Sheet

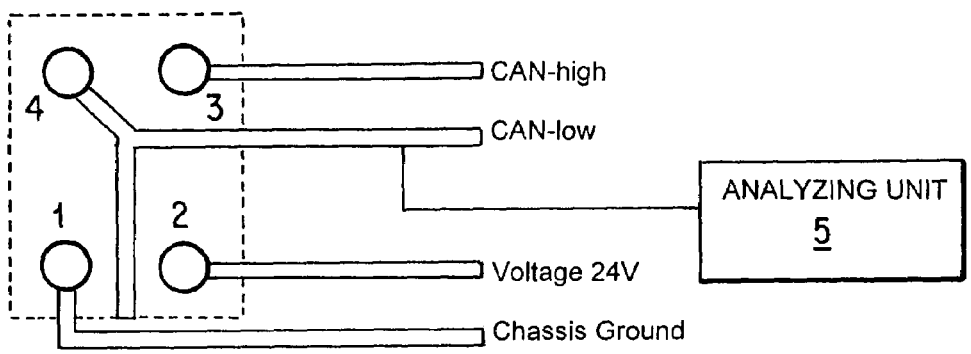

ARRANGEMENT FOR DETECTING A LEAKAGE CURRENT OR DEFECT CURRENT

The invention relates to a circuit arrangement for the detection of a leakage current or defect current, by means of which the power supply of an electronic circuit can be switched off as well as to a method of operating such a circuit arrangement.

In the case of electronic control units which, because of their usage site, are exposed to environmental influences, and may become untight when the protective housing is damaged, foreign substances may penetrate into the electronic space which may interfere with the function and may even cause a fire. The entering of electrolyte-containing splashing water, particularly of saline solutions, represents such a danger. If saline solution arrives between voltage-carrying contact points, an ionic fault current will flow. Because of the resulting electrolysis, this may lead to fire in certain situations. As long as the electronic functionality of the control unit is not influenced such that the control unit is switched off because of malfunctioning, the fire-promoting electrolytic production of, for example, hydrogen and chlorine gas will continue. This problem of the exposure of electronic control units to environmental influences is particularly predominant in the vehicle industry in which, specifically in the commercial vehicle sector, electronic control units are mounted directly on the truck frame and are fully exposed to the splashing salt water of the road in winter. A production of electrolysis gases not detected in a damaged control unit and a resulting fire may cause devastating personal injuries and damage to property particularly in a tunnel.

Electronic or mechatronic components according to the state of the art, installed, for example, in the vehicle industry, on the vehicle frame exposed to environmental influences, are, as a rule, supplied by way of a switched vehicle voltage. Within such components, monitoring circuits can switch off many circuit parts. However, the voltage applied directly to the plug of the power supply lines can be switched off only by a monitoring circuit of a preceding component. The switching-off can take place, for example, after measuring an excessive current consumption or, in the simplest case, by means of a safety fuse responding in the event of an excessive current. However, with the starting appearance of the fault current releasing electrolyses gases, the change of the current consumption is very low and cannot be differentiated from the regular current consumption which is subjected to large fluctuations. Although, at the point in time at which the electrolysis results in fire, a significant current increase can be measured, in order to prevent a fire, the current supply would have had to be switched off beforehand.

It is an object of the invention to provide a circuit arrangement for detecting a leakage or defect current, by means of which the power supply of an electronic circuit can be switched off as soon as the fault current starts and before the fault current reaches an extent which would result in a fire risk.

This object is achieved by means of an arrangement having the characteristics of Claim 1 and by a method having the characteristics of Claim 7. Advantageous further developments are indicated in the subclaims.

The circuit arrangement according to the invention for detecting a leakage current or defect current, by means of which the power supply of an electronic circuit can be switched off, has a track conductor connected with a signal line, or an insulation-layer-free conductor, or an insulation-layer-free part of the signal line itself which is arranged such that it crosses a potential leakage current connection path of a short circuit between the power supply lines. The fact that the track conductor or the insulation-layer-free conductor crosses a potential leakage current connection path of a short circuit between the power supply lines does not only mean that the track conductor or the insulation-layer-free conductor precisely crosses the connection line between the leakage current lead-in and lead-out points at the power supply lines, but that, with respect of the current distribution of the leakage current, it crosses it proportionally such that a resulting electric signal on the signal line can be picked up by means of standard electronic devices. The basic idea of the invention is that the signal line or a branch line thereof is constructed such that it is influenced by a fault current, for example, a result of a wetting with an ionic conductor, such as a saline solution. A preceding electronic component having an analyzing circuit can detect this influence, switch off the power supply in time and thereby prevent a fire.

In an advantageous embodiment of the invention, the strip conductor connected with a signal line or the insulation-layer-free conductor or the insulation-layer-free part of the signal line is arranged between two insulation-free connection surfaces, particularly soldering surfaces or bonding surfaces of the power supply lines. A leakage current between these two contact areas, as caused by a wetting with an ionic conductor, such as a saline solution, is crossed by the signal line or a branch line thereof and sets it to an intermediate potential. The signal line or a branch line thereof acts like a receiver of a voltage divider.

Advantageously, the signal line is a sensor line or a communication line, particularly a CAN bus line. As a result, a defect current can be detected by an analysis of the sensor signal or by an analysis of a breakup of the communication signal.

The track conductor connected with a signal line or the insulation-layer-free conductor preferably is a branch line of a CAN line. As a result of receiving the leakage current potential by means of a branch line of a CAN line, its line tracking does not have to be changed and the potential change caused by the leakage current can easily be determined on the CAN line.

An analyzing logic preferably detects a leakage or defect current by means of the potential height, a signal breakup or an interference in the data flow of the signal line.

The advantages of the circuit arrangement according to the invention are particularly important when the circuit arrangement is part of an electronic unit of an electronic brake system EBS. Because of the mounting of the electropneumatic modulators on the frame of utility vehicles, electronic circuits in electropneumatic modulators are particularly endangered in the event of untight housings and the entering of salt water from the road.

An embodiment of the invention is illustrated in a drawing.

The sole FIGURE is a very simplified schematic representation of a printed circuit board of a circuit arrangement according to the invention.

Four contact points are arranged on a printed circuit board. At a contact point 1, a grounding conductor of a voltage supply is mounted; at contact point 2, a 24 V voltage-carrying line of the voltage supply is mounted; at contact point 3, a "CAN-high" line of a pair of signal conductors is mounted; and at a contact point 4, a "CAN-low" line of a pair of signal conductors is mounted. An insulation-free branch line branches off from the "CAN-low" line of the pair of signal conductors which branch line extends precisely in the center through between the contact points 1 and 2 of the voltage supply and ends freely at the edge of the printed circuit board. When the printed circuit board is wetted with a saline solution layer, which extends continuously from contact point 1 to contact point 2 and thus establishes a conductive connection between the two voltage supply contact points, this results in a fault current between the voltage supply contact points. This fault current path crosses the branch line and sets it and therefore the "CAN-low" line to a potential of between 0 and 24 V. By way of this potential change, a fault current can be detected by an analyzing logic (e.g., analyzing unit 5) connected with the "CAN-low" line. The voltage supply is then switched off, and the electrolysis process at the voltage supply contact point is prevented at the transition from the electronic to the ionic conduction. The risk of fire because of the released electrolysis gases is therefore prevented.

REFERENCE NUMBERS

1 Contact point
2 contact point
3 contact point
4 contact point

The invention claimed is:

1. A circuit arrangement for detecting a leakage or defect current by which a power supply of an electronic circuit having a signal line can be switched off, the circuit arrangement comprising:
    one of a strip conductor connected with the signal line, an insulation-layer-free conductor connected with the signal line, and an insulation-layer-free portion of the signal line itself, being arranged to cross a potential leakage or defect current connection path of a short circuit extending between lines of the power supply to the electronic circuit;
    wherein the signal line is one of a pair of signal lines connected to the electronic circuit.

2. The circuit arrangement according to claim 1, further comprising two insulation-free connection surfaces for the lines of the power supply; and
    wherein said one of the strip conductor, insulation-layer-free conductor, and insulation-layer-free part of the signal line itself, is arranged between the two insulation-free connections surfaces.

3. The circuit arrangement according to claim 2, wherein the two insulation-free connection surfaces are one of soldering and bonding surfaces of the lines of the power supply.

4. The circuit arrangement according to claim 1, wherein the signal line is one of a sensor line and a communication line.

5. The circuit arrangement according to claim 4, wherein the signal line is a CAN bus line.

6. The circuit arrangement according to claim 2, wherein the signal line is one of a sensor line and a communication line.

7. The circuit arrangement according to claim 1, wherein the strip conductor connected with a signal line or the insulation-layer-free conductor is a branch line of a CAN signal line.

8. The circuit arrangement according to claim 2, wherein the strip conductor connected with a signal line or the insulation-layer-free conductor is a branch line of a CAN signal line.

9. The circuit arrangement according to claim 1, further comprising an analyzing unit detecting the leakage current or defect current via a potential magnitude on the signal line, a signal breakup on the signal line, or an interference in data flow occurring on the signal line.

10. The circuit arrangement according to claim 2, further comprising an analyzing unit detecting the leakage current or defect current via a potential magnitude on the signal line, a signal breakup on the signal line, or an interference in data flow occurring on the signal line.

11. The circuit arrangement according to claim 5, further comprising an analyzing unit detecting the leakage current or defect current via a potential magnitude on the signal line, a signal breakup on the signal line, or an interference in data flow occurring on the signal line.

12. The circuit arrangement according to claim 1, wherein the circuit arrangement is part of the electronic unit of an electronic brake system.

13. The circuit arrangement according to claim 2, wherein the one of the strip conductor, insulation-layer-free conductor, and insulation-layer-free part of the signal line itself, extends through a point precisely halfway between the two insulation-free connections surfaces.

14. A method of operating a circuit arrangement, for detecting a leakage or defect current by which a power supply of an electronic circuit having a signal line can be switched off, the circuit arrangement comprising one of a strip conductor connected with the signal line, an insulation-layer-free conductor connected with the signal line, and an insulation-layer-free portion of the signal line itself, being arranged to cross a potential leakage or defect current connection path of a short circuit extending between lines of the power supply to the electronic circuit, wherein the signal line is one of a pair of signal lines connected to the electronic circuit, the method comprising the acts of:
    detecting the leakage current or the defect current by utilizing the strip conductor, insulation-layer-free conductor, or insulation-layer-free part of the signal line itself; and
    switching-off the power supply when the leakage current or defect current is detected.

15. An electronic unit for a vehicle which electronic unit receives via power supply lines, the electronic unit comprising:
    two insulation-free connection surfaces for the power supply lines, which connection surfaces are spaced apart from another;
    a signal line; and
    one of a strip conductor connected with the signal line, an insulation-layer-free conductor connected with the signal line, and an insulation-layer-free portion of the signal line itself, being arranged to cross a potential leakage or defect current path of a short circuit between the two connection surfaces;
    wherein the signal line is one of a pair of signal lines connected to the electronic circuit.

* * * * *